US009620356B1

(12) United States Patent
Bashyam et al.

(10) Patent No.: US 9,620,356 B1
(45) Date of Patent: Apr. 11, 2017

(54) PROCESS OF SELECTIVE EPITAXIAL GROWTH FOR VOID FREE GAP FILL

(71) Applicant: Applied Materials, Inc., Santa Clara, CA (US)

(72) Inventors: Ramakrishnan Bashyam, San Jose, CA (US); Kazuyoshi Iwama, Chiba (JP); Peichun Lv, Singapore (SG); Carlos Caballero, Diamond Bar, CA (US); Taisen Kawahiro, Tokyo (JP)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/926,494

(22) Filed: Oct. 29, 2015

(51) Int. Cl.
*H01L 21/02* (2006.01)
*H01L 21/768* (2006.01)

(52) U.S. Cl.
CPC .. *H01L 21/02293* (2013.01); *H01L 21/02164* (2013.01); *H01L 21/76877* (2013.01); *H01L 21/76879* (2013.01)

(58) Field of Classification Search
CPC ......... H01L 21/02293; H01L 21/02164; H01L 21/76877; H01L 21/76879
See application file for complete search history.

(56) References Cited

U.S. PATENT DOCUMENTS

| | | | | |
|---|---|---|---|---|
| 6,074,478 A * | 6/2000 | Oguro | ................ | C30B 29/06 117/935 |
| 6,818,537 B2 * | 11/2004 | Cheong | ............. | H01L 21/76879 257/E21.171 |
| 7,075,161 B2 * | 7/2006 | Barth | ................ | G01N 33/48721 257/414 |
| 8,324,699 B2 * | 12/2012 | Ichijo | ...................... | C23C 16/02 257/228 |
| 2002/0022347 A1 * | 2/2002 | Park | ................... | H01L 21/02381 438/478 |
| 2006/0160288 A1 * | 7/2006 | Leith | ..................... | C23C 16/045 438/197 |
| 2008/0169534 A1 * | 7/2008 | Dip | ................... | H01L 21/02381 257/622 |
| 2009/0286402 A1 | 11/2009 | Xia et al. | | |
| 2011/0256726 A1 * | 10/2011 | LaVoie | .................. | C23C 16/045 438/702 |
| 2012/0052683 A1 | 3/2012 | Kim et al. | | |
| 2012/0276711 A1 | 11/2012 | Yoon et al. | | |
| 2012/0309194 A1 | 12/2012 | Xu et al. | | |
| 2013/0109144 A1 * | 5/2013 | Kim | .................. | H01L 21/02532 438/301 |
| 2013/0122699 A1 | 5/2013 | Wang | | |

(Continued)

*Primary Examiner* — Michael Jung
(74) *Attorney, Agent, or Firm* — Patterson + Sheridan, LLP

(57) ABSTRACT

Methods and apparatuses for filling an epitaxial layer into a trench/via/structure formed in a substrate with good deposition profile control and film uniformity across the substrate are provided. In one embodiment, a method of depositing a epitaxial layer on the substrate includes supplying a gas mixture having a first ratio of a dichlorosilane gas to a chlorine containing gas into the processing chamber, altering the gas mixture to have a second ratio of the dichlorosilane gas to the chlorine containing gas into the processing chamber, maintaining a substrate temperature of between about 600 degrees Celsius and about 1000 degrees Celsius, and filling an opening formed in a substrate.

15 Claims, 3 Drawing Sheets

(56) References Cited

U.S. PATENT DOCUMENTS

| | | | |
|---|---|---|---|
| 2014/0306250 A1* | 10/2014 | Gardner | H01L 25/0753 257/89 |
| 2015/0137204 A1 | 5/2015 | Wang et al. | |
| 2015/0243763 A1* | 8/2015 | Cheng | H01L 27/14614 438/270 |
| 2015/0303051 A1* | 10/2015 | Takeda | H01L 21/0228 438/758 |
| 2016/0141173 A1* | 5/2016 | Moriya | H01L 21/02532 438/479 |

* cited by examiner

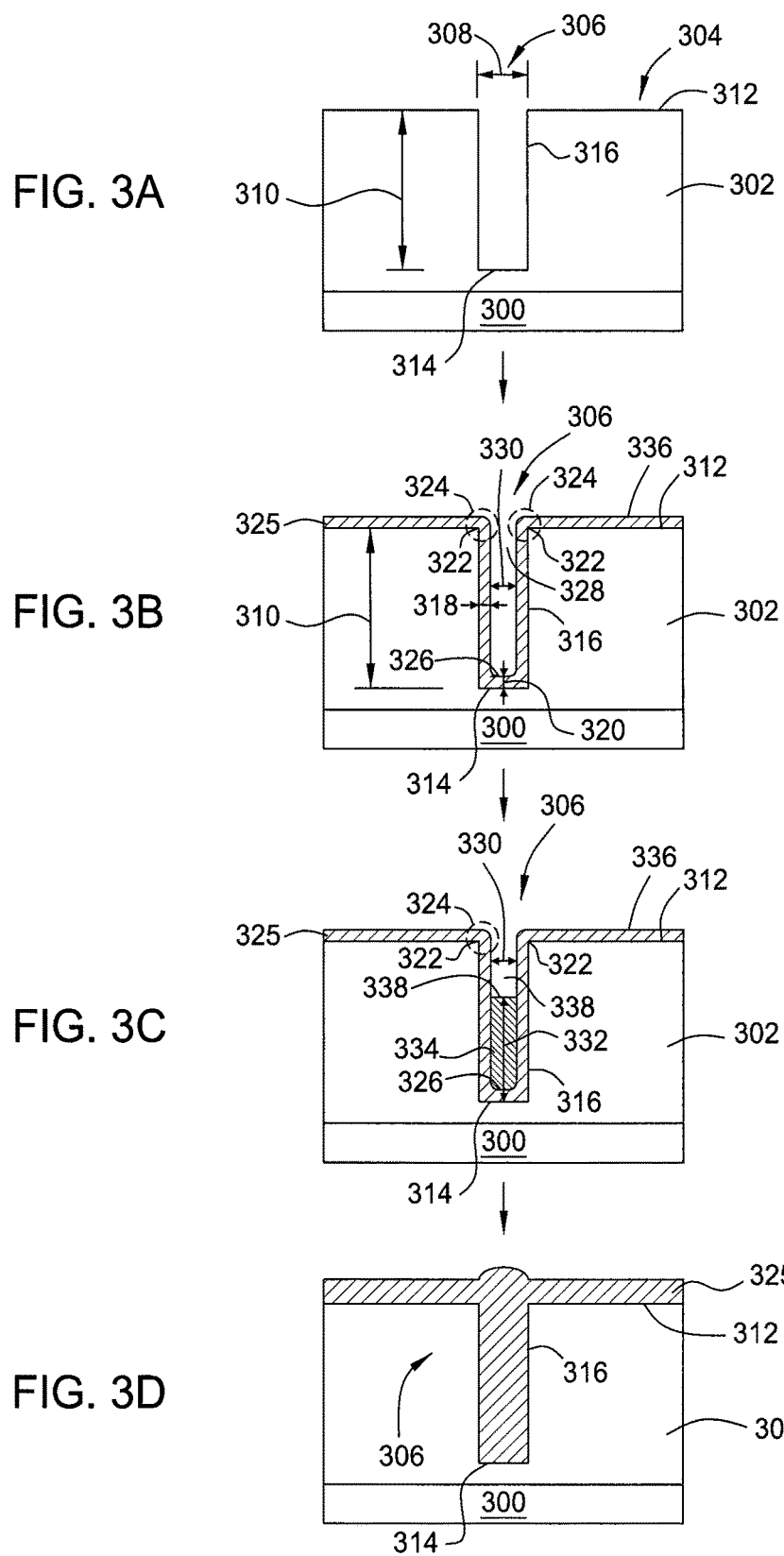

PROCESS OF SELECTIVE EPITAXIAL GROWTH FOR VOID FREE GAP FILL

FIELD

Embodiments described herein generally relate to methods and apparatuses for forming semiconductor devices. More particularly, embodiments described herein generally relate to methods and apparatuses for filling in trenches in a device structure for semiconductor applications.

BACKGROUND

Reliably producing submicron and smaller features is one of the key technologies for the next generation of very large scale integration (VLSI) and ultra large scale integration (ULSI) of semiconductor devices. However, as the miniaturization of circuit technology is pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase for next generation devices, the widths of interconnects, such as junctions, vias, trenches, contacts, gate structures and other features, as well as the dielectric materials therebetween, decrease to 45 nm and 32 nm dimensions and beyond, whereas the thickness of the epitaxial layers remain substantially constant, with the result of increasing the aspect ratios of the features. Many traditional deposition processes have difficulty filling narrow vertical structures with small width where the aspect ratio exceeds 10:1. For example, a silicon layer deposited using a deposition process often suffer from poor step coverage, overhang, seams, and voids formed within the via or trench when the via is less than 30 nm or having a high aspect ratio. Insufficient deposition on the bottom and sidewall of the vias or trenches can also result in deposition discontinuity, thereby leading to device shorting or poor interconnection formation.

Conventionally, a gap-fill deposition process may include both deposition and etching steps so as to fill a structure with high aspect ratios without early close-up of the openings during the deposition process. However, these processes often require high process temperature, which may adversely create processes to the device structures formed on the substrate with low thermal budget. Furthermore, high temperature process for a gap-fill process often requires high manufacturing cost and longer overall process time.

Therefore, there is a great amount of ongoing effort being directed at the formation of substantially void-free, seam-free and conformal submicron features having high aspect ratios or small dimensions.

SUMMARY

Methods and apparatuses for filling an epitaxial layer into a trench/via/structure formed in a substrate with good deposition profile control and film uniformity across the substrate are provided. In one embodiment, a method of depositing a epitaxial layer on the substrate includes supplying a gas mixture having a first ratio of a dichlorosilane gas to a chlorine containing gas into the processing chamber, altering the gas mixture to have a second ratio of the dichlorosilane gas to the chlorine containing gas into the processing chamber, maintaining a temperature of a substrate disposed in the processing chamber to between about 600 degrees Celsius and about 1000 degrees Celsius, and filling an opening formed in the substrate with a dielectric material.

In another embodiment, a method of depositing an epitaxial layer on the substrate includes performing a deposition process in a first mode to form a first portion of an epitaxial layer in an epitaxial growth chamber, continuing performing the deposition process in a second mode to form a second portion of the epitaxial layer in the epitaxial growth chamber, and filling an opening formed in the substrate with the epitaxial layer deposited using the first and second modes, wherein the opening has a depth greater than 30 µm.

In yet another embodiment, a method of depositing an epitaxial layer on the substrate includes performing a deposition process by supplying a gas mixture having a ratio of a dichlorosilane gas to a HCl gas between about 1:10 and about 10:10 in an epitaxial growth chamber to deposit an epitaxial layer, switching the ratio of the dichlorosilane gas to the HCl gas in the gas mixture to between about 1:10 and about 10:10 to continue to deposit the epitaxial layer, and filling the epitaxial layer in an opening formed in the substrate with the deposited epitaxial layer, wherein the opening has a depth greater than 30 µm.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings.

FIGS. 3A-3D depict cross-sectional views of a trench being filled with a material by a process of FIG. 2 in accordance with one embodiment of the present disclosure.

To facilitate understanding, identical reference numerals have been used, where possible, to designate identical elements that are common to the figures. It is contemplated that elements disclosed in one embodiment may be beneficially utilized on other embodiments without specific recitation.

It is to be noted, however, that the appended drawings illustrate only typical embodiments of this disclosure and are therefore not to be considered limiting of its scope, for the disclosure may admit to other equally effective embodiments.

DETAILED DESCRIPTION

Methods and apparatuses for depositing an epitaxial layer onto a substrate having features with high aspect ratios and/or with small dimensions are provided. As discussed herein, high aspect ratio of the features refers to the submicron structures having aspect ratio in excess of 3:1, and high aspect ratio greater than 10:1. The deposition process may include supplying gas mixture with different gas ratios during different time period of a deposition process to perform alternating a fast path deposition step and a slow path deposition step so as to fill a gap in a structure without early close-up of the structure to avoid voids formed in the gap in the structure. By adjusting the gas ratio of the gases supplied in the gas mixture during the deposition process, a good profile control and film uniformity formed across the substrate surface may be obtained.

Figure 1:
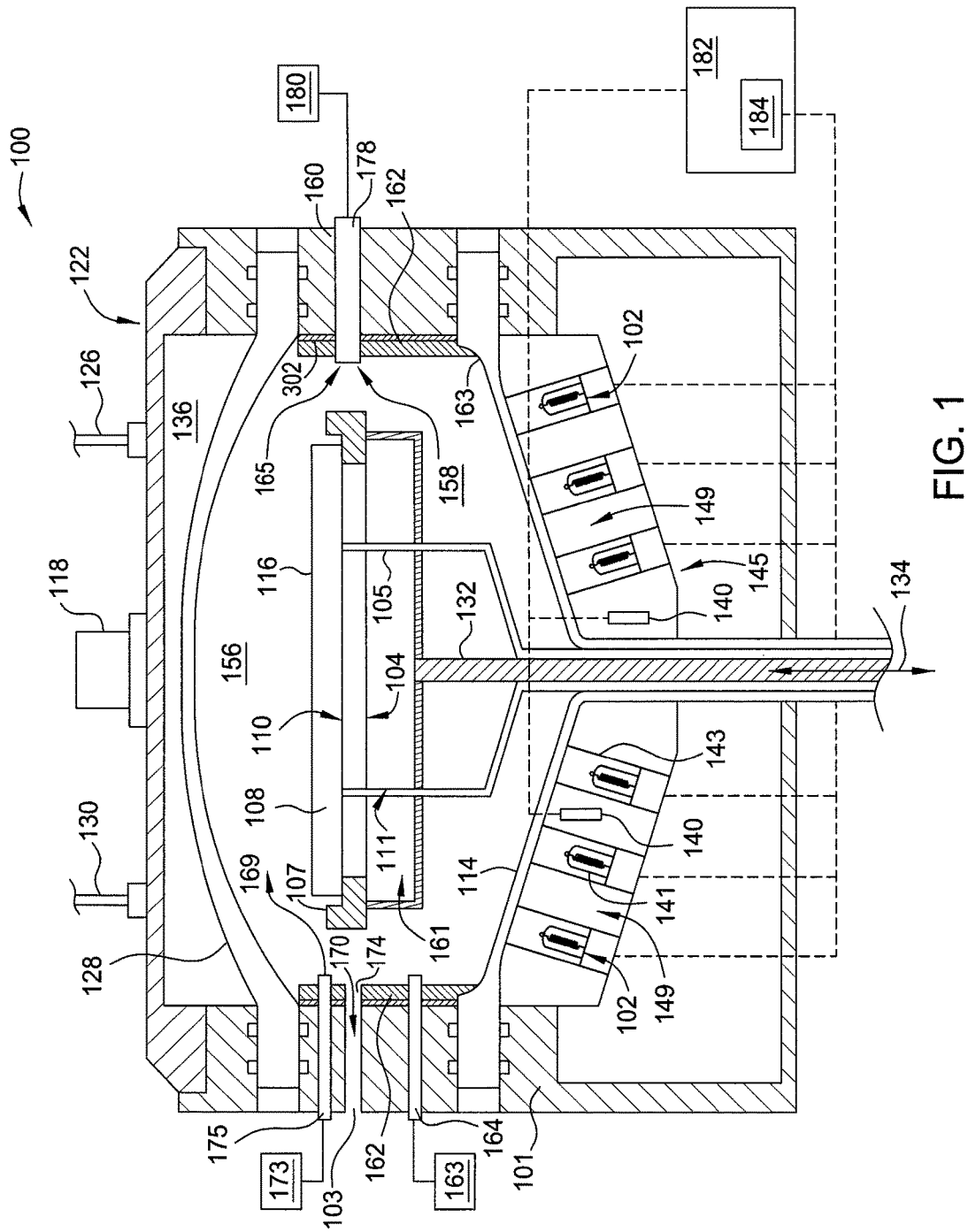
FIG. 1 is a cross section view of an illustrative processing chamber in which embodiments of the disclosure may be practiced.

FIG. 1 is a schematic sectional view of a processing chamber 100 according to one embodiment of the invention. Suitable processing chambers that may be adapted for use with the teachings disclosed herein include, for example, an Epi® processing chamber available from Applied Materials, Inc. of Santa Clara, Calif. Although the processing chamber 100 is shown including a plurality of features that enable superior deposition performance, it is contemplated that other processing chambers may be adapted to benefit from one or more of the inventive features disclosed herein.

The processing chamber 100 may be used to process one or more substrates, including deposition of a material on an upper surface of a substrate, such as an upper surface 116 of a substrate 108 depicted in FIG. 1. The processing chamber 100 includes a chamber body 101 connected to, an upper dome 128 and a lower dome 114. In one embodiment, the upper dome 128 may be fabricated from a material such as a stainless steel, aluminum, or ceramics. Suitable ceramic include quartz, including bubble quartz (e.g., quartz with fluid inclusions), alumina, yttria, or sapphire. The upper dome 128 may be thermally controlled by introducing a thermal control fluid, such as a cooling gas, through an inlet portal 126 into a thermal control space 136, and withdrawing the thermal control fluid through an exit portal 130. In some embodiments, a cooling gas circulating through the thermal control space 136 may reduce deposition on an inner surface of the upper dome 128.

An array of radiant heating lamps 102 is disposed below the lower dome 114 for heating, among other components, a backside 104 of a substrate support 107 disposed within the processing chamber 100. During deposition, the substrate 108 may be brought into the processing chamber 100 and positioned onto the substrate support 107 through a loading port 103. The lamps 102 are adapted to the heat the substrate 108 to a predetermined temperature to facilitate thermal decomposition of process gases supplied into the processing chamber to deposit a material on onto the upper surface 116 of the substrate 108. The lamps 102 may be adapted to heat the substrate 108 to a temperature of about 300 degrees Celsius to about 1200 degrees Celsius, such as about 300 degrees Celsius to about 950 degrees Celsius.

The lamps 102 may include bulbs 141 surrounded by an optional reflector 143 disposed adjacent to and beneath the lower dome 114 to heat the substrate 108 as the process gas passes thereover to facilitate the deposition of the material onto the upper surface 116 of the substrate 108. The lamps 102 are arranged in annular groups of increasing radius around a shaft 132 of the substrate support 107. The shaft 132 is formed from quartz and contains a hollow portion or cavity therein, which reduces lateral displacement of radiant energy near the center of the substrate 108, thus facilitating uniform irradiation of the substrate 108. In one embodiment, each lamp 102 is coupled to a power distribution board (not shown) through which power is supplied to each lamp 102. The lamps 102 are positioned within a lamphead 145 which may be cooled during or after processing by, for example, a cooling fluid introduced into channels 149 located between the lamps 102. The lamphead 145 conductively cools the lower dome 114 due in part to the close proximity of the lamphead 145 to the lower dome 114. The lamphead 145 may also cool the lamp walls and walls of the reflectors 143. If desired, the lampheads 145 may be in contact with the lower dome 114.

The substrate support 107 is shown in an elevated processing position, but may be moved vertically by an actuator (not shown) to a loading position below the processing position to allow lift pins 105 to contact the lower dome 114. The lift pins 105 pass through holes 111 in the substrate support 107 and raise the substrate 108 from the substrate support 107. The substrate support 107 disposed in the processing chamber 100 divides the internal volume of the processing chamber 100 into a process gas region 156 (above the front side 110 of the substrate support 107) and a purge gas region 158 (below the substrate support 107). The substrate support 107 is rotated during processing by a central shaft 132 to minimize the effects of thermal and process gas flow spatial non-uniformities within the processing chamber 100, and thus facilitate uniform processing of the substrate 108. The substrate support 107 is supported by the central shaft 132, which moves the substrate 108 in an up and down direction 134 during loading and unloading, and in some instances, during processing of the substrate 108. The substrate support 107 may be formed from a material having low thermal mass or low heat capacity, so that energy absorbed and emitted by the substrate support 107 is minimized. The substrate support 107 may be formed from silicon carbide or graphite coated with silicon carbide to absorb radiant energy from the lamps 102 and rapidly conduct the radiant energy to the substrate 108.

A liner assembly 162 may be disposed within the chamber body 101 and is surrounded by the inner circumference of the base plate 160. The liner assembly 162 may be formed from a process-resistant material and generally shields the processing volume (i.e., the process gas region 156 and purge gas region 158) from metallic walls of the chamber body 101. An opening 170, such as a slit valve, may be disposed through the liner assembly 162 and aligned with the loading port 103 to allow for passage of the substrate 108.

An optical pyrometer 118 may be disposed at a region above the upper dome 128. The optical pyrometer 118 measures a temperature of the upper surface 116 of the substrate 108. A reflector 122 may be optionally placed outside the upper dome 128 to reflect infrared light that is radiating from the substrate 108 or transmitted by the substrate 108 back onto the substrate 108. The reflector 122 can be made of a metal such as aluminum, gold or stainless steel. The reflector 122 can have the inlet portal 126 and exit portal 130 to carry a flow of a fluid such as water for cooling the reflector 122.

A plurality of thermal radiation sensors 140, which may be pyrometers or light pipes, such as sapphire light pipes, may be disposed in the lamphead 145 for measuring thermal emissions of the substrate 108. The sensors 140 are typically disposed at different locations in the lamphead 145 to facilitate viewing (i.e., sensing) different locations of the substrate 108 during processing.

Process gas supplied from a process gas supply source 173 is introduced into the process gas region 156 through a process gas inlet port 175 formed in the sidewall of the base plate 160. The process gas inlet port 175 is configured to direct the process gas in a generally radially inward direction. The process gas exits the process gas region 156 (along flow path 165) through a gas outlet port 178 located on the opposite side of the processing chamber 100 relative to the process gas inlet port 175. Removal of the process gas through the gas outlet port 178 may be facilitated by a vacuum pump 180 coupled thereto. Purge gas supplied from a purge gas source 163 is introduced to the purge gas region 158 through a purge gas inlet port 164 formed in the sidewall of the base plate 160. During the film formation process, the substrate support 107 is located at a position such that the purge gas flows along flow path 161 across a back side 104 of the substrate support 107. The purge gas exits the purge gas region 158 and is exhausted out of the process chamber through the gas outlet port 178 located on the opposite side of the processing chamber 100 relative to the purge gas inlet port 164.

During processing, a controller 182 receives data from the sensors 140 and separately adjusts the power delivered to each lamp 102, or individual groups of lamps or lamp zones, based on the data. The controller 182 may include a power supply 184 that independently powers the various lamps 102 or lamp zones. The controller 182 can be configured to produce a desired temperature profile on the substrate 108, and based on comparing the data received from the sensors 140, the controller 182 may adjust the power to lamps and/or lamp zones to conform the observed (i.e., sensed) thermal data indicating of the lateral temperature profile of the substrate with to the desired temperature profile. The controller 182 may also adjust power to the lamps and/or lamp zones to conform the thermal treatment of one substrate to the thermal treatment of another substrate, to prevent chamber performance drift over time.

Figure 2:
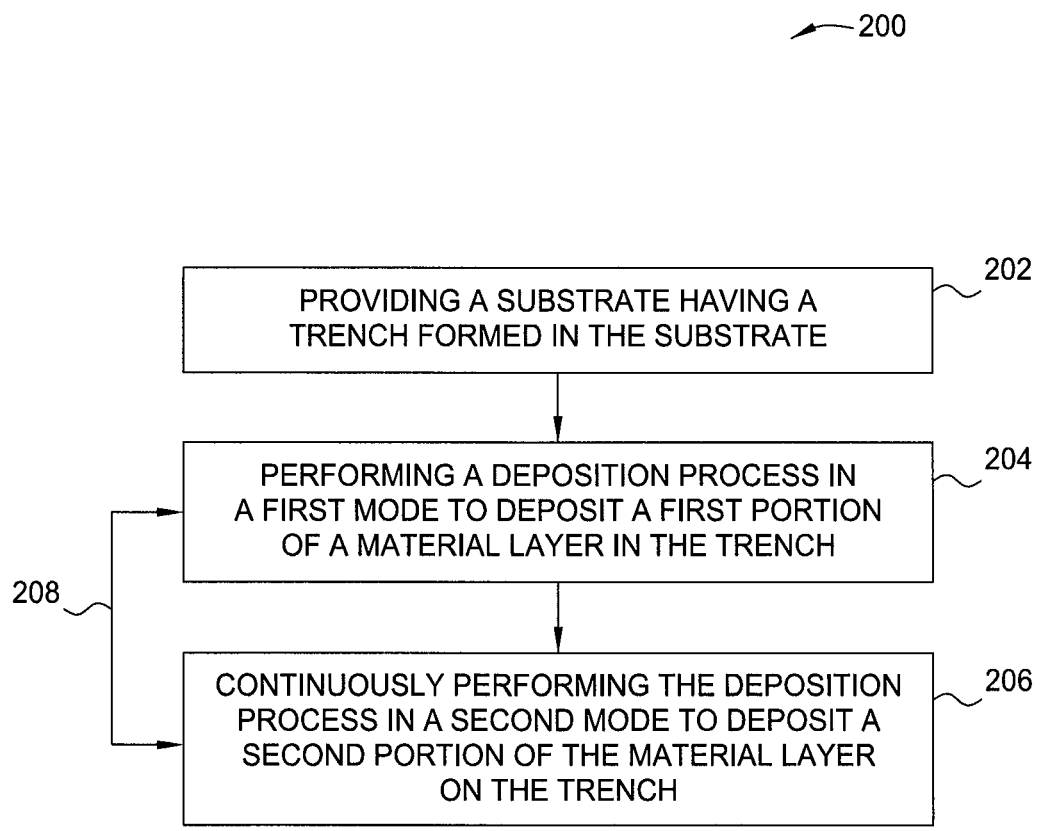
FIG. 2 depicts a flow diagram for performing a gap-fill process in accordance with one embodiment of the disclosure.

FIG. 2 depicts a flow diagram for a process 200 of forming and filling an epitaxial layer into a substrate. FIGS. 3A-3D depict a schematic cross-sectional view of an exemplary application of an epitaxial layer that may be formed on a substrate 300 by utilizing the process 200.

The process 200, which may be stored in computer readable form in the memory of the controller 182 or other storage medium, begins at operation 202 when the substrate 300 is transferred to and placed on the substrate support pedestal assembly 110 disposed in the processing chamber 100, such as with the substrate 108 as depicted in FIG. 1.

The process 200 starts at operation 202 by transferring the substrate 300 having a desired feature, such as a structure 304, formed thereon into a process chamber, such as the processing chamber 100, as depicted in FIG. 1. "Substrate" or "substrate surface," as used herein, refers to any substrate or material surface formed on a substrate upon which film processing is performed. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, quartz, and any other materials such as metals, metal nitrides, metal alloys, and other conductive materials, depending on the application. Barrier layers, metals or metal nitrides on a substrate surface may include titanium, titanium nitride, titanium silicide nitride, tungsten, tungsten nitride, tungsten silicide nitride, tantalum, tantalum nitride, or tantalum silicide nitride. Substrates may have various dimensions, such as 200 mm, 300 mm, or 450 mm diameter wafers, as well as, rectangular or square panes. Substrates include semiconductor substrates, display substrates (e.g., LCD), solar panel substrates, and other types of substrates. Unless otherwise noted, embodiments and examples described herein are conducted on substrates with a 150 mm, 200 mm diameter or a 300 mm, or a 450 mm diameter. Substrates on which embodiments of the invention may be useful include, but are not limited to semiconductor wafers, such as crystalline silicon (e.g., Si<100> or Si<111>), silicon oxide, glass, quartz, strained silicon, silicon germanium, doped or undoped polysilicon, doped or undoped silicon wafers and patterned or non-patterned wafers. Substrates may be exposed to a pretreatment process to polish, etch, reduce, oxidize, hydroxylate, anneal and/or bake the substrate surface.

In one embodiment, the substrate 300 may have a material layer 302, as shown in FIG. 3A, formed on the substrate 300. The material layer 302 may be a silicon-containing layer, a doped silicon layer, a silicon dioxide layer, a group III-V material, a Ge containing layer, a doped Ge layer, polysilicon layer, crystalline silicon layer or a low-k epitaxial layer. The material layer 302 having a top surface 312 may be patterned and etched to form an opening 306 (a via or a trench). In one embodiment, the opening 306 may be a void, an aperture, a cavity, a gap, a hole, a trench or any suitable structures or features that a dielectric containing layer may be formed therein to form a structure, such as a junction structure or a super-junction (SJ) structure. The opening 306 may have sidewalls 316 and a bottom 314 formed within the material layer 302. The opening 306 may have an aspect ratio (a depth 310 versus a width 308 of the opening 306) ranging from 1:2 to 1:30. In one example, the depth 310 of the opening 306 may be at least about 30 μm.

At operation 204, a first mode of a multi-mode deposition process is performed by supplying a gas mixture to the processing chamber 100 while operating in the first mode to form a portion of an epitaxial layer 325 to the opening 306 formed on the substrate 300, as shown in FIG. 3B. The deposition process described herein is an epitaxial growth process. In one embodiment, the gas mixture may include a silicon containing gas and a chlorine containing gas. Suitable examples of silicon containing gas include $SiH_4$, dichlorosilane (DCS) gas, trichlorosilane (TCS), or other suitable silicon containing gas. Suitable examples of the chlorine containing gas include HCl, $Cl_2$, or the like. In one exemplary embodiment, the gas mixture supplied to the process chamber 100 includes dichlorosilane (DCS) gas and HCl gas. The dichlorosilane (DCS) gas may be supplied at a flow rate between about 0.1 slm and about 1 slm. The HCl gas flow may be controlled at a flow rate between about 0.1 slm and about 2 slm. The epitaxial layer 325 formed on the substrate 300 is a doped silicon containing layer or a doped silicon layer.

In one embodiment, the dichlorosilane (DCS) gas and the HCl gas supplied in the gas mixture may be regulated at a predetermined ratio. As the HCl gas has a relatively reactive chlorine etchant ($Cl^-$), as compared to dichlorosilane (DCS) gas, the Cl atoms included in the gas mixture may slightly etch the epitaxial layer 325 while growing and filling the epitaxial layer 325 in the opening 306. Thus, a controlled amount of HCl gas supplied in the gas mixture may suppress the deposition rate (e.g., less etching or sputtering effect) during the deposition process so as to control the profile of the epitaxial layer 325 formed in the opening 306. Therefore, by controlling the ratio of dichlorosilane (DCS) gas and HCl gas supplied in the gas mixture, different deposition effect may be obtained and controlled so as to control the deposition rate and particularly the deposition profile during the process. By doing so, a good control of deposition profile and distribution may be obtained, thereby efficiently controlling the deposition efficiency and deposition behavior of material deposited on the substrate during the deposition process.

In one embodiment, in the operation 204 with the processing chamber operating in the first mode, a relatively higher deposition rate, as compared to the deposition rate at operation 206 which will be described later below, is desired. The higher deposition rate at operation 206 may form the epitaxial layer 325 conformally on the sidewalls 316 as well as the bottom 314 of the openings 306. Due to the narrow width 308 of the opening 306, the epitaxial layer 325 formed on the sidewall 316 may be slightly thinner than the epitaxial layer 325 formed on the bottom 314. For example, the epitaxial layer 325 may have a first width 318 formed on the sidewall 316 slightly thinner than a second width 320 formed on the bottom 314 of the opening 306. In another example, the first width 318 formed on the sidewall 316 is substantially equal and symmetric to the second width formed from the bottom 314 of the opening 306.

Additionally, as the faster deposition rate at operation 204 may increase likelihood of forming undesirable overhangs at the corners 322 of the opening 306, as indicated by the circle 324, resulting in the openings 306 being early closed up by excess deposits on the corners 322. Thus, at an iteration of the operation 204, only a portion, e.g., about one third, of the epitaxial layer 325 is formed to gradually and efficiently control the deposition profile of the epitaxial layer 325 formed in the opening 306 to prevent early close-up of the opening 306 prior to the epitaxial layer 325 substantially filling a gap 328 defined by the opening 306.

In one embodiment, during the deposition step at operation 204 of the deposition process, the ratio of the dichlorosilane (DCS) gas as supplied in the gas mixture at operation 204 is relatively higher than the DCS gas supplied in the gas mixture at operation 206. It is believed that a high ratio of the dichlorosilane (DCS) gas supplied in the gas mixture can assist having a higher deposition rate with greater amount of Si atoms supplied in the gas mixture. It is noted that the ratio of the dichlorosilane (DCS) gas in the gas mixture at operation 204 may be in any arrangement as needed. In one example, the ratio of the dichlorosilane (DCS) gas to HCl gas in the gas mixture may be controlled at between about 1:10 and about 10:10, for example between about 3:10 and about 9:10, such as between about 7.5:10.

During deposition occurring in the first mode, e.g., higher deposition mode, the process pressure may be controlled at between about 10 Torr and about 200 Torr. The substrate temperature may be controlled at less than 1100 degrees, such as between about 600 degrees Celsius and about 1000 degrees Celsius. In one example, the deposition process during first mode performed at operation 204 has a duration of between about 5 seconds and about 5000 seconds.

At operation 206, after the first portion of the epitaxial layer 325 has formed on the substrate 300 with the predetermined thickness, a second mode of the multi-mode deposition process is continuously performed in the processing chamber 100. The second mode of the deposition process has the ratio of the DCS gas and the HCl gas supplied in the gas mixture altered or changed to deposit the epitaxial layer 325 with a different deposition profile as compared to deposition in the first mode. In one example, at operation 206, the ratio of the DCS gas supplied in the gas mixture in the second mode is lowered compared to the DCS gas supplied in the gas mixture supplied in the first mode at operation 204. During operation 206, a relatively slower deposition rate is used to deposit the remaining epitaxial layer 325 in the opening 306, resulting in a relatively better bottom deposition profile with the epitaxial layer 334 formed from the bottom surface 314. It is believed that a relatively low deposition rate with higher HCl gas flow in the gas mixture may allow a slow deposition of the epitaxial layer 325 while slightly removing overhangs, if any, from the opening 306 to allows the silicon atoms from the DCS gas to more effectively reach down to the bottom 314 of the opening 306 to deposit the epitaxial layer 325 thereon. The relatively high HCl gas flow in the gas mixture may slightly reopen the openings 306 so as to continuous depositing and filling the epitaxial layer 325 and the bottom epitaxial layer 325 into the openings 306.

With the slower deposition rate at operation 206, a good deposition management may be obtained, thus providing good and sufficient bottom coverage when filling epitaxial layer 325 into the openings 306.

During the second mode of the deposition process performed at operation 206, the ratio of the DCS gas to the HCl gas is between about 1:10 and about 5:10, such as about 4:10. The relatively high HCl ratio in the gas mixture is believed to provide a gentle etch/sputtering/eroding effect to smoothly remove overhang, if any, from the openings 306 that may be formed during the deposition process. As such, the gap 338 remaining in the opening 306 may be shrunk from the bottom as the opening 306 is gradually filled by the epitaxial layer 325. Therefore, by efficiently controlling ratio of the DCS gas and the HCl gas supplied in the gas mixture, a good sidewall and bottom profile management formed in the openings 306 may be obtained. In one example, the deposition process of second mode performed at operation 206 is performed for a duration of between about 5 seconds and about 5000 seconds.

During deposition in the second mode, e.g., lower deposition mode, the process pressure may be controlled to be between about 10 Torr and about 200 Torr. The substrate temperature may be controlled to be less than 1100 degrees, such as between about 600 degrees Celsius and about 1000 degrees Celsius. It is noted that the process parameters, in some embodiments, controlled at the operation 204 and the operation 206 may be substantially the same except the gas ratio between the DCS gas and the HCl gas.

It is noted that the operation 204 and 206 may be iteratively performed, as indicated by the loop 208, until the gap 338 of the opening 306 is substantially filled with the epitaxial layer 325 with the desired thickness. In one example, the operation 204 and the operation 206 may be repeatedly performed for as many times as desired. In another example, the operation 204 and the operation 206 may be repeated for once and further perform an additional step of operation 204 (e.g., operation 204→operation 206→operation 204) until the epitaxial layer 325 is formed on the substrate 300.

Thus, by utilizing deposition process with at least two different modes, a higher deposition rate for a first period of time and a lower rate for a second period of time or different combinations, a good sidewall and bottom deposition management may be obtained so as to fill a gap with high aspect ratio in the substrate without voids or defects.

While the foregoing is directed to embodiments of the disclosure, other and further embodiments of the disclosure may be devised without departing from the basic scope thereof.

What is claimed is:

1. A method of depositing an epitaxial layer on a substrate disposed in a processing chamber, comprising:
   supplying a gas mixture having a first ratio of dichlorosilane gas to chlorine containing gas into the processing chamber;
   altering the gas mixture supplied to the processing chamber from the first ratio to a second ratio of dichlorosilane gas to chlorine containing gas, wherein the first ratio has a higher gas flow of dichlorosilane gas than a gas flow of dichlorosilane gas in the second ratio;
   maintaining a temperature of the substrate disposed in the processing chamber between 600 degrees Celsius and 1000 degrees Celsius; and forming a doped silicon containing epitaxial layer in an opening formed in the substrate, the epitaxial layer formed from the gas mixture and filling the opening in the substrate,
wherein the first ratio of dichlorosilane gas to chlorine containing gas is between 1:10 and 10:10, and
wherein the second ratio of dichlorosilane gas to chlorine containing gas is between 1:10 and 10:10.

2. The method of claim 1, wherein forming the doped silicon containing epitaxial layer comprises:
performing an epitaxial growth process.

3. The method of claim 1, wherein forming the doped silicon containing epitaxial layer comprises:
depositing the doped silicon containing epitaxial layer to a thickness greater than 30 μm.

4. The method of claim 1, wherein the chlorine containing gas is HCl.

5. The method of claim 1, wherein forming the doped silicon containing epitaxial layer comprises:
forming a first portion of the doped silicon containing epitaxial layer on the substrate while the gas mixture is provided at the first ratio.

6. The method of claim 5, wherein forming the doped silicon containing epitaxial layer further comprises:
forming a second first portion of the doped silicon containing epitaxial layer on the substrate while the gas mixture is provided at the second ratio.

7. The method of claim 6, wherein the first portion of the doped silicon containing epitaxial layer is one third of a total thickness of the doped silicon containing epitaxial layer.

8. The method of claim 1, further comprising:
altering the gas mixture from the second ratio of dichlorosilane gas to chlorine containing gas back to the first ratio.

9. The method of claim 1, wherein the epitaxial layer is a doped silicon layer.

10. The method of claim 1, wherein the opening has an aspect ratio greater than 3:1.

11. The method of claim 1, wherein the opening formed in the substrate is configured to form a super junction structure for semiconductor applications.

12. A method of depositing an epitaxial layer on a substrate, comprising:

performing a deposition process in a first mode to form a first portion of a doped silicon containing epitaxial layer in an epitaxial growth chamber;
continuously performing the deposition process in a second mode to form a second portion of the doped silicon containing epitaxial layer in the epitaxial growth chamber; and
forming the doped silicon containing epitaxial layer in an opening formed in the substrate to fill the opening in the substrate, wherein the opening has a depth greater than 30 μm, wherein the first mode of the deposition process comprises a first ratio of dichlorosilane gas to HCl gas, and the second mode of the deposition process comprises a second ratio of dichlorosilane gas to HCl gas and the first ratio has a higher gas flow of dichlorosilane gas than the gas flow of dichlorosilane gas in the second ratio, wherein the first ratio is between 1:10 and 10:10 and the second ratio is between 1:10 and 10:10.

13. The method of claim 12, further comprising:
switching the deposition process from the second mode to the first mode until the epitaxial layer fills the opening defined in the substrate.

14. A method of depositing an epitaxial layer on the substrate, comprising:
performing a deposition process by supplying a gas mixture having a first ratio of dichlorosilane gas to HCl gas of between 1:10 and 10:10 in an epitaxial growth chamber to deposit a doped silicon containing epitaxial layer;
switching the first ratio of dichlorosilane gas to HCl gas in the gas mixture to a second ratio between 1:10 and 10:10 while continuing to deposit the doped silicon containing epitaxial layer, wherein the first ratio has a higher gas flow of dichlorosilane gas than a gas flow of dichlorosilane gas in the second ratio; and
forming the doped silicon containing epitaxial layer in an opening formed in the substrate with the doped silicon containing epitaxial layer, wherein the opening has a depth greater than 30 μm.

15. The method of claim 14, wherein the epitaxial layer is a doped silicon layer.

* * * * *